US006553957B1

United States Patent
Ishikawa et al.

(10) Patent No.: US 6,553,957 B1
(45) Date of Patent: Apr. 29, 2003

(54) COMBINATION OF CYLINDER LINER AND PISTON RING OF INTERNAL COMBUSTION ENGINE

(75) Inventors: Yoshiki Ishikawa, Tochigi (JP); Hideyo Iwama, Tochigi (JP); Yoshio Naito, Tochigi (JP); Takashi Takakura, Hino (JP); Kousuke Ito, Hino (JP); Tatsuya Suzuki, Hino (JP)

(73) Assignees: Nippon Piston Ring Co., Ltd., Saitama (JP); Hino Motors Ltd., Tokyo (JP)

(*) Notice: Subject to any disclaimer, the term of this patent is extended or adjusted under 35 U.S.C. 154(b) by 0 days.

(21) Appl. No.: 09/868,592

(22) PCT Filed: Sep. 29, 2000

(86) PCT No.: PCT/JP00/06753

§ 371 (c)(1),
(2), (4) Date: Jun. 20, 2001

(87) PCT Pub. No.: WO01/33065

PCT Pub. Date: May 10, 2001

(30) Foreign Application Priority Data

Oct. 29, 1999 (JP) ............................................ 11-308761

(51) Int. Cl.$^7$ ............................................ F32B 15/04
(52) U.S. Cl. .............................. 123/193.2; 123/193.5; 123/193.6

(58) Field of Search .......................... 123/193.5, 193.2, 123/193.6, 668

(56) References Cited

U.S. PATENT DOCUMENTS

| 3,900,200 | A | * | 8/1975 | Nakamura ............... 277/235 A |
| 3,932,228 | A | * | 1/1976 | Sugiyama et al. ....... 123/193.5 |
| 4,495,907 | A | * | 1/1985 | Kamo ...................... 123/193.5 |
| 5,148,780 | A | * | 9/1992 | Urano et al. ............. 123/193.2 |
| 5,566,450 | A | * | 10/1996 | Rao et al. .............. 29/888.061 |
| 5,592,927 | A | * | 1/1997 | Zaluzec et al. ............. 123/668 |
| 5,618,590 | A | * | 4/1997 | Naruse et al. .............. 427/528 |
| 5,629,091 | A | * | 5/1997 | Rao et al. .................... 428/403 |
| 5,743,536 | A | * | 4/1998 | Kokmkuro et al. ..... 277/235 A |
| 5,960,762 | A | * | 10/1999 | Imai ........................ 123/193.4 |
| 5,970,941 | A | * | 10/1999 | Bock ....................... 123/193.3 |
| 6,139,984 | A | * | 10/2000 | Onoda et al. ............... 428/698 |

* cited by examiner

Primary Examiner—Marguerite McMahon
(74) Attorney, Agent, or Firm—Birch, Stewart, Kolasch & Birch, LLP

(57) ABSTRACT

A cylinder liner and a piston ring adapted to be combined therewith in an internal combustion engine are provided that have excellent abrasion resistance, where iron oxide film is formed at least on a part of the inner circumferential surface of the cylinder liner, and metallic nitride film is formed at least on a sliding surface of the piston ring sliding along the cylinder liner.

9 Claims, 1 Drawing Sheet

COMBINATION OF CYLINDER LINER AND PISTON RING OF INTERNAL COMBUSTION ENGINE

This application is the national phase under 35 U.S.C. §371 of PCT International Application No. PCT/JP00/06753 which has an International filing date of Sep. 29, 2000, which designated the United States of America and was not published in English.

TECHNICAL FIELD

The present invention relates to a cylinder liner, and to a combination of a cylinder liner and a piston ring, suitable for use in internal combustion engines, such as diesel engines.

BACKGROUND TECHNOLOGY

Cylinder liners in conventional internal combustion engines are made of steel, or cast iron, where, as for cast iron cylinder liners, both types are used that have, and do not have, a nitride layer formed on the surface thereof. Piston rings adapted to be combined with such cylinder liners, typically have had a hard Cr plating layer provided on a sliding surface thereof for sliding along the cylinder liners. With this combination, because a piston ring having a hard Cr plating film is excellent in abrasion resistance, and a cast iron cylinder liner provides enhanced sliding characteristics due to graphite and steadite, unique to cast iron, excellent scuffing resistance and sufficient abrasion resistance have been secured.

The applicants of the present patent patent application proposed in Japanese Patent Laid-Open Publications No. 7-180608 (1995) and No. 8-178068 (1996), respectively, implementation of internal combustion engines of a smaller size and a lighter weight, operating at a higher speed, than previously, and improvement of aggression resistance (capability of being resistant to aggression from the counterpart thereof sliding therealong) of the piston, by replacing the hard Cr plating film with a Cr—N alloy PVD (physical vapor deposition) film.

Piston rings and cylinder liners in diesel engines have been looking to improved abrasion resistance because the operating conditions of the diesel engines are becoming severer due to such causes as exhaust emission regulations.

An object of the present invention is to provide a cylinder liner and more particularly the combination of a cylinder liner and a piston ring having excellent abrasion resistance, for use in an internal combustion engine, particularly in a diesel engine.

DISCLOSURE OF THE INVENTION

In order to achieve the object described above, the first means employed by the present invention is to provide a cylinder liner in an internal combustion engine where the piston ring slides along the inner circumferential surface of the cylinder liner, wherein the cylinder liner has an iron oxide film formed at least on a part of the inner circumferential surface of the cylinder liner. The second means employed by the present invention provides a piston ring having a metallic nitride film formed at least on a sliding surface thereof which slides along the cylinder liner.

The type of cylinder liner is either a dry type or a wet type, and the base material of the cylinder liner is either cast iron, or steel. The cast iron, as the base material of the cylinder liners, is typically flake graphite cast iron, but may be either one of nodular graphite cast iron, CV cast iron, eutectic graphite cast iron, white heart malleable cast iron, high-chromium cast iron, and black heart malleable cast iron. As for steel, any steel material may be usable, where recommendable steels may include machine structural carbon steels, such as S43C, S45C, sS48C and S50C of JIS (Japanese Industrial Standards), and high-carbon chromium bearing steels, such as SUJ2 of JIS. Heat treatment may be either one of partial chill-hardening and partial surface hardening of certain areas, such as dead points, on the inner circumferential surface of the cylinder liners, and overall quenching and surface quenching of the cylinder liners. The cylinder liners, either of steel, or cast iron, may be provided with the application of one or more treatments, e. g:, nitriding treatment, boride forming treatment, sulphurizing treatment, carburizing treatment, ionimplanting treatment, metal diffusion/vapor deposition treatment, melt-spray coating treatment, surface hardening build-up chemical conversion treatment (oxide coating treatment, phosphate coating treatment and molten-salt carbonizing treatment) and resin-impregnating treatment, by applying such treatment thereto before the forming of the iron oxide film, or compositely with the forming of the iron oxide film. In addition, a shot peening treatment can be applied before or after forming the iron oxide film.

The iron oxide film formed at least on a part of the inner circumferential surface of the cylinder liner, has a thickness of 0.5–100 $\mu$m and comprises a compound layer mainly of $Fe_3O_4$ (also containing $Fe_2O_3$ and FeO) and a diffusion layer, or a single compound layer, or a single diffusion layer. The iron oxide film is formed by means of either one treatment from air plasma spray coating, molten nitrate treatment, and water vapor treatment. The iron oxide film has numerous pores of around 1-$\mu$m diameter on its rough surface, thereby having a high oil-maintaining capability, resulting in excellent abrasion resistance due to a subsequent oiling effect, which in turn extends the life of the cylinder liners. The iron oxide film also is chemically stable, and thereby is resistant to corrosive abrasion.

The piston ring is formed, using either cast iron, or steel, as a base material. As the piston ring base material, specifically, a base material is used that is selected from materials either containing cast iron of FCD 500 or over, martensite stainless steel (e.g., containing Cr at 5 to 20 percent by mass, or mass %, C at 0.16 to 1.4 mass %, MO, V, Co, and Al), or Si—Cr steel.

The metallic nitride film of the piston ring is formed either on the cast iron base material or on a nitride layer formed on the base material. This nitride layer may protect the piston ring from being exposed after the film is worn off.

The metallic nitride may be preferably either one from Cr—N alloy, Cr—B—N alloy, Ti—N alloy, and Cr—B—V—N alloy. Here, Cr—N alloy and Cr—B—N alloy may include alloys that contain oxygen at 1to 15 mass %, and carbon at 1 to 15 mass %, respectively, in a solid solution state within their crystal structures.

The metallic nitride film to be formed on the sliding surface of the piston ring that slides along the cylinder liner, may be formed by means of either PVD or CVD (chemical vapor deposition), such as sputtering and ion-plating methods. The film is a layer that improves scuffing resistance and abrasion resistance of the piston ring, and may have a thickness of 5–120 $\mu$m.

When the piston ring is provided with a nitride layer, the nitride layer of a thickness of 5–120 $\mu$m is preferably formed on an entire surface of the base material to prevent knocking abrasion that occurs on the upper and lower end surfaces of the piston by being knocked against a corresponding ring groove in the piston.

Alternatively, instead of forming metallic nitride film on a piston ring, a carbon-based film (diamond-like carbon, metal diamond carbon), plating (Cr plating, laminated Cr plating, composite plating), and melt-spray coating (plasma spray coating, Mo+$Mo_2$C+NiCr, Mo+NiCrBSi, Mo+$Mo_2$C+NiCrBSi, CrC/NiCr, and the like), can be formed respectively as a protective layer, or dry processed, whereby similar effects may be also obtained.

The cylinder liner, according to the present invention, is arranged to have iron oxide film formed by means of water vapor treatment at least on a part of the inner circumferential surface thereof, and the piston ring (first compression ring), according to the present invention, is arranged to have PVD film of either Cr—N alloy, Cr—B—N alloy (containing oxygen at 1 to 15 mass %, and carbon at 1 to 15 mass %, respectively, in a solid solution state within their crystal structures), Ti—N alloy, or Cr—B—V—N alloy. The cylinder liner and the piston ring, according to the present invention exhibit effects in that they have excellent abrasion resistance and have enough endurance to be used for a long period of time, even in a diesel engine operating under severe running conditions.

BEST EMBODIMENTS OF THE INVENTION

Figure 1:
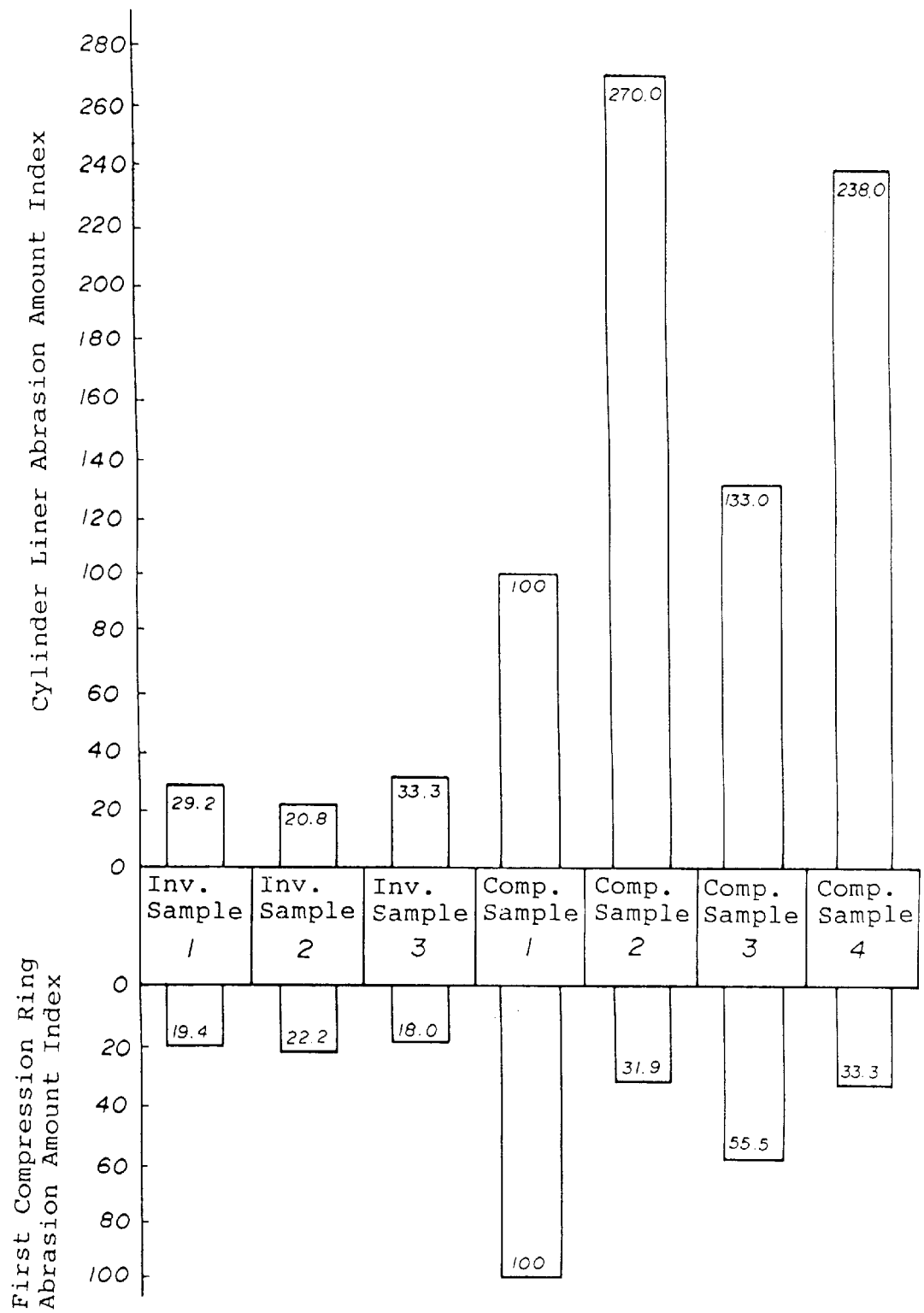
FIG. 1 is a graph showing abrasion in cylinder liners and first compression rings of inventive samples, according to the present invention, and comparative samples of the prior art.

As described above, the inner circumferential surface of the cylinder liner, according to the present invention, mainly of $Fe_3O_4$ (also containing $Fe_2O_3$ and FeO) iron oxide film, has very excellent abrasion resistance and a long life, while the sliding surface of the piston ring, according to the present invention, of metallic nitride film, such as Cr—B—V—N alloy, Cr—N alloy, Cr—B—N alloy, and Ti—N alloy, has sufficient abrasion resistance and scuffing resistance. Therefore, abrasion in the piston ring and the cylinder liner can be greatly reduced even in a diesel engine under severe running conditions.

Steel cylinder liners may be made of steel material having a hardness of Hv 190 or over, and is selectively provided with application of treatment, such as overall quenching, surface quenching, sulphurizing treatment, and carburizing treatment. As for the steel material, material can be employed, such as tempered SUJ2 and S45C materials having sufficient mechanical strength, e.g., tensile strength and impact resistance.

Hereunder, tests will be explained that were conducted on cylinder liners and piston rings (first compression rings) of inventive samples embodied according to the present invention, and of comparative samples of prior art.

The base materials of inventive samples 1–3 and comparative samples 1–4 for the cylinder liner, are of the same cast iron, having characteristics, as shown below.

| [Chemical Composition](Mass %) | |
| --- | --- |
| TC: | 2.80–3.50 |
| Si: | 1.50–2.50 |
| Mn: | 0.50–1.00 |
| P: | 0.20–0.50 |
| S: | <0.13 |
| Cu: | 0.20–0.60 |
| Mo: | 0.10–0.50 |
| B: | 0.07–0.11 |
| [Structure] | |
| Graphite: | Flake |
| Body: | Pearlite, Special Steadite |
| [Physical Property] | |
| Hardness: | 95–105 ($H_RB$) |

The base materials of inventive samples 1–3 and comparative samples 1–4 for the first compression rings, are all of the same material of 17 Cr stainless steel.

The inner circumferential surface of the cylinder liners and the sliding surface of the first compression rings of inventive (Inv.) samples 1–3 and comparative (Com.) samples 1–4 are as shown below.

| | Inner Circumferential Surface of Cylinder Liners | Sliding Surface of First Compression Rings |
| --- | --- | --- |
| Inv. Sample 1 | iron oxide film | Cr—N alloy PVD film |
| Inv. Sample 2 | iron oxide film | Cr—B—N alloy PVD film |
| Inv. Sample 3 | iron oxide film | Cr—B—V—N alloy PVD film |
| Com. Sample 1 | no film | Cr plating layer |
| Com. Sample 2 | nitride layer | Cr plating layer |
| Com. Sample 3 | no film | Cr—N alloy PVD film |
| Com. Sample 4 | nitride layer | Cr—N alloy PVD film |

Here, the iron oxide films of the cylinder liners are formed by means of the water vapor treatment at 570 degrees C. for 2 hours, where the film thickness is about 10 μm and the film hardness is Hv 500 or over. The nitride layers of the cylinder liners are formed by means of the nitriding treatment at 500 degrees C. for 5 hours, where the layer thickness is about 50 μm altogether with the diffusion layer and the compound layer, and the layer hardness is Hv 880.

The Cr—N alloy PVD films of the piston rings are Cr—N alloys consisting of Cr—N (mainly {200}), where the film thickness is about 30 μm and the film hardness is Hv 1000.

The Cr—B—N alloy PVD films of the piston rings are Cr—B—N alloys consisting of Cr—N (mainly {111}) containing B at 1–2 mass %, where the film thickness is about 30 and the film hardness is Hv 2000.

The Cr—B—V—N alloy PVD films of the piston rings are Cr—B—V—N alloys consisting of Cr—N (mainly {200}) containing B at 0.05–20 mass % and V at 0.1–30 mass %, where the film thickness is about 30 μm and the film hardness is Hv 2000.

The Cr plating layers of the piston rings have a thickness of about 100 μm and a hardness of Hv 900.

With the cylinder liners and the first compression rings of these inventive (Inv.) samples 1–3 and comparative (Com.) samples 1–4 installed in an actual diesel engine, the actual engine was operated for a specified time.

The operating conditions for this actual engine were as follows:
Engine Used: Diesel Engine
Total Displacement: 11 L
Engine Speed: $35S^{-1}$ (2,100 rpm)

Lubricant: 10 W-30
Load: Full Load
Operating Time: 100 hours

After the operation was completed, abrasion amounts in the cylinder liners and the first compression rings of inventive (Inv.) samples 1–3 and comparative (Com.) samples 1–4 were measured. FIG. 1 is a graph showing the measurement results.

From this graph, it is known that, as for abrasion amounts in the cylinder liners, the inventive samples 1, 2, and 3 that have iron oxide film have very small abrasion amounts, the comparative samples 1 and 3 that have no film have relatively large abrasion amounts, and the comparative samples 2 and 4 that have nitride layers have very large abrasion amounts. The first compression rings of the inventive sample 1, and the comparative samples 3 and 4, that slide along the cylinder liners, have the same Cr—N alloy PVD film. However, the fact that the abrasion amounts in the cylinder liners of the inventive samples 1, 2, and 3 are very small, is considered to be caused by the power of the iron oxide film.

It is also seen that, as for abrasion amounts in first compression rings, the inventive samples 1, 2, and 3 that have PVD film layer, have the smallest abrasion amounts, and the comparative sample 2 that has Cr plating film and the comparative sample 4 that has Cr—N alloy PVD film, have abrasion amounts next to the smallest, while the comparative sample 3 that has the same Cr—N alloy PVD film as the comparative sample 4 has a relatively large abrasion amount, and the comparative sample 1 that has Cr plating film has a very large abrasion amount. This can be said to show that the abrasion amount in the first compression ring are caused by the synergistic effect of the inner circumferential surface of a cylinder liner combined with the ring. Among such combinations, combinations in the inventive samples 1, 2, and 3, are optimal where a cylinder liner having iron oxide film is combined with a first compression ring having either Cr—N alloy PVD film, Cr—B—N alloy PVD film, or Cr—B—V—N alloy PVD film.

What is claimed is:

1. A combination of a cylinder liner and a piston ring suitable for use in an internal combustion engine, wherein the cylinder liner is made of cast iron or steel, said cast iron or steel containing an iron oxide film provided on at least a part of an inner circumferential surface of the cylinder liner, said iron oxide film containing $Fe_3O_4$ as a major constituent, and wherein the iron oxide film is formed by either molten nitrate treatment or water vapor treatment.

2. A combination of a cylinder liner and a piston ring suitable for use in an internal combustion engine, wherein the cylinder liner is made of cast iron or steel, said cast iron or steel containing an iron oxide film provided on at least a part of an inner circumferential surface of the cylinder liner, said iron oxide film containing $Fe_3O_4$ as a major constituent, wherein the iron oxide film is formed by either molten nitrate treatment or water vapor treatment, and wherein the piston ring contains a metallic nitride film on at least a sliding surface thereof.

3. The combination of the cylinder liner and piston ring of claim 2, wherein the metallic nitride film is formed by PVD or CVD.

4. The combination of the cylinder liner and piston ring of claim 2, wherein the metallic nitride film is selected from the group consisting of Cr—N alloy, Cn—B—N alloy, Ti—N alloy and Cr—B—V—N alloy.

5. A combination of a cylinder liner and a piston ring suitable for use in an internal combustion engine, wherein the cylinder liner is made of cast iron or steel, said cast iron or steel containing an iron oxide film provided on at least a part of an inner circumferential surface of the cylinder liner, said iron oxide film containing $Fe_3O_4$ as a major constituent, wherein the metallic nitride contains oxygen in an amount of 1 to 15 mass %, and carbon in an amount of 1 to 15 mass %, in a solid solution state within the crystal structure of Cr—N, and wherein the piston ring contains a metallic nitride film on at least a sliding surface thereof.

6. The combination of the cylinder liner and piston ring of claim 5, wherein the metallic nitride film has a thickness of about 5 to 120 µm.

7. The cylinder liner and piston ring combination of claim 5, wherein a nitride layer is formed between the base material of the piston ring and the metallic nitride film.

8. A combination of a cylinder liner and a piston ring suitable for use in an internal combustion engine, wherein the cylinder liner is made of cast iron or steel, said cast iron or steel containing an iron oxide film provided on at least a part of an inner circumferential surface of the cylinder liner, said iron oxide film containing $Fe_3O_4$ as a major constituent wherein the iron oxide film has numerous pores having diameters of approximately 1 µm.

9. The combination of the cylinder liner and piston ring of claim 8, wherein the iron oxide film has a thickness of 0.5 to 100 µm.

* * * * *

UNITED STATES PATENT AND TRADEMARK OFFICE
CERTIFICATE OF CORRECTION

PATENT NO. : 6,553,957 B1  Page 1 of 1
DATED : April 29, 2003
INVENTOR(S) : Yoshiki Ishikawa et al.

It is certified that error appears in the above-identified patent and that said Letters Patent is hereby corrected as shown below:

Column 6,
Lines 14-17, should read

-- 4. The combination of the cylinder liner and piston ring of claim 2, wherein the metallic nitride film is selected from the group consisting of Cr-N alloy, Cr-B-N alloy, Ti-N alloy and Cr-B-V-N alloy. --

Signed and Sealed this

Fourteenth Day of October, 2003

JAMES E. ROGAN
*Director of the United States Patent and Trademark Office*